United States Patent
Park et al.

(10) Patent No.: US 10,146,501 B1
(45) Date of Patent: Dec. 4, 2018

(54) SOUND CONTROL BY VARIOUS HAND GESTURES

(71) Applicant: QUALCOMM Incorporated, San Diego, CA (US)

(72) Inventors: Kee-Hyun Park, San Diego, CA (US); Heekab Shin, San Diego, CA (US); Keunsung Lee, Camberley (GB); Srinivas Reddy Julakanti, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/611,366

(22) Filed: Jun. 1, 2017

(51) Int. Cl.
| | |
|---|---|
| *H04R 5/00* | (2006.01) |
| *G06F 3/16* | (2006.01) |
| *G06F 3/01* | (2006.01) |
| *H03G 3/18* | (2006.01) |
| *G06F 3/0484* | (2013.01) |
| *G10L 19/16* | (2013.01) |
| *G11B 19/02* | (2006.01) |
| *G06K 9/00* | (2006.01) |

(52) U.S. Cl.
CPC .............. *G06F 3/165* (2013.01); *G06F 3/013* (2013.01); *G06F 3/017* (2013.01); *G06F 3/04842* (2013.01); *G10L 19/167* (2013.01); *H03G 3/18* (2013.01); *G06K 9/00201* (2013.01); *G11B 19/025* (2013.01)

(58) Field of Classification Search
CPC .......... G06F 3/165; G06F 3/013; G06F 3/017; G06F 3/04842; G10L 19/167; G06K 9/00201; H03G 3/18

USPC .............. 381/58, 17; 715/716; 700/94
See application file for complete search history.

(56) References Cited

U.S. PATENT DOCUMENTS

| | | | |
|---|---|---|---|
| 9,766,715 B2* | 9/2017 | Fujimaki | G06F 3/0304 |
| 2002/0151997 A1* | 10/2002 | Wilcock | G11B 19/025 |
| | | | 700/94 |
| 2008/0048878 A1* | 2/2008 | Boillot | G06F 3/017 |
| | | | 340/686.1 |
| 2010/0102939 A1* | 4/2010 | Stewart | G10H 1/34 |
| | | | 340/384.1 |
| 2012/0075168 A1* | 3/2012 | Osterhout | G02B 27/017 |
| | | | 345/8 |
| 2013/0259238 A1* | 10/2013 | Xiang | G06F 3/017 |
| | | | 381/17 |
| 2013/0346168 A1 | 12/2013 | Zhou et al. | |
| 2014/0129937 A1 | 5/2014 | Jarvinen et al. | |
| 2014/0160424 A1 | 6/2014 | Benko et al. | |
| 2015/0084884 A1* | 3/2015 | Cherradi El Fadili | |
| | | | G06F 3/041 |
| | | | 345/173 |

(Continued)

OTHER PUBLICATIONS

Roland Corporation, Roland Fantom X6, X7, X8 Owners Manual, 2004, All pages Pertinent.*

*Primary Examiner* — Paul S Kim
*Assistant Examiner* — Ubachukwu Odunukwe
(74) *Attorney, Agent, or Firm* — Kilpatrick Townsend & Stockton/Qualcomm

(57) ABSTRACT

Methods, systems, computer-readable media, and apparatuses for gesture recognition are disclosed for audio control. The gestures can be used for audio control in virtualized environments. The audio control can include generating a sound that mimics an effect of a modification of a sound wave that would occur if the gesture were performed in a non-virtualized environment.

21 Claims, 12 Drawing Sheets

(56) References Cited

U.S. PATENT DOCUMENTS

| | | |
|---|---|---|
| 2015/0138064 A1 | 5/2015 | Li et al. |
| 2015/0193193 A1* | 7/2015 | Khaira .................... G06F 3/165 381/109 |
| 2016/0078278 A1* | 3/2016 | Moore ............... G06K 9/00201 345/8 |
| 2016/0320847 A1 | 11/2016 | Coleman et al. |

* cited by examiner

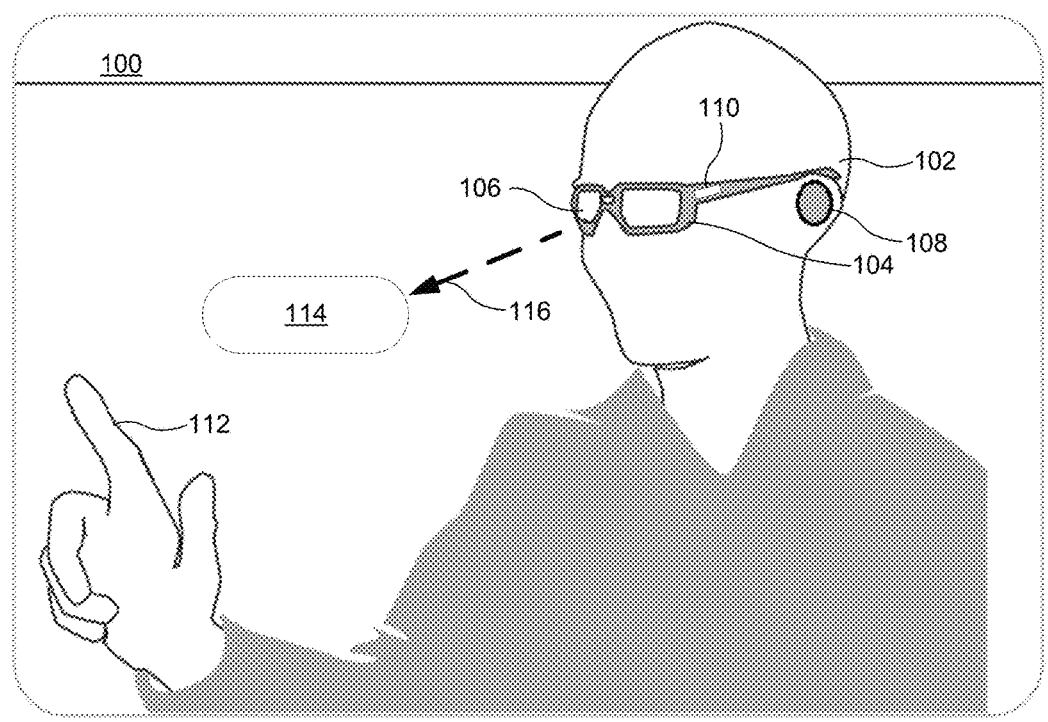
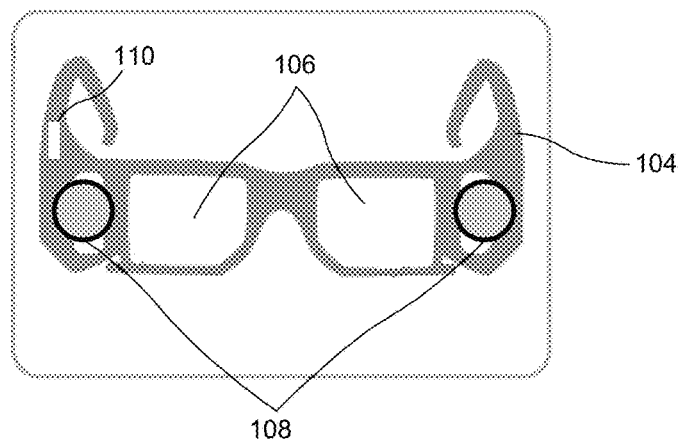
FIG. 1

900

--- means for identifying a gesture performed by a user via the control object, wherein the gesture is a gesture performed to modify sound waves travelling toward the user's ear, the modification caused by interaction of the sound waves with the control object.
902

↓ Signal from means for identifying

Means for generating a first signal based on the identifying the gesture.
904

↓ Signal from means for generating

Means for transmitting the first signal.
906

↓ First Signal

Means for generating sound.
908

FIG. 9

SOUND CONTROL BY VARIOUS HAND GESTURES

BACKGROUND

Aspects of the disclosure relate to gesture-based audio control.

Audio controls can take many forms. For example, a device, such as a smartphone or other mobile device may include a rocker switch or other such physical device to adjust a volume of audio generated by the device. Certain devices, such as mixing tables, device implementing professional audio software, and stereos can include more fully featured audio controls including equalizer(s), fade, balance, line level, etc. Classical audio control using physical switches (e.g., push-button, rotary, or rocker switches) can be used to control audio in a variety of devices. In a virtualized environment (e.g., augmented or virtual reality), audio control can utilize simulated and/or physical switches. However, such controls may not be flexible and/or intuitive within a virtualized environment.

BRIEF SUMMARY

Certain embodiments are described pertaining to gesture-based audio control. Techniques include a system that can include one or more sensors configured to detect a control object; a transducer; and one or more processors coupled to the one or more sensors and the transducer. The one or more processors can be configured to identify, using the one or more sensors, a gesture performed by a user via the control object, wherein the gesture is a gesture performed to modify sound waves travelling toward the user's ear, the modification caused by interaction of the sound waves with the control object. The one or more processors can also be configured to generate a first signal based on the identifying the gesture. The one or more processors can additionally be configured to transmit the first signal to the transducer, the first signal causing the transducer to: (1) generate a sound that mimics an effect of the modification to the sound waves by the control object via the gesture; or (2) cease generating a sound to mimic an effect of the modification to the sound waves by the control object via the gesture.

The one or more processors can be further configured to transmit the first signal to the transducer while the gesture is identified; and cease transmitting the first signal to the transducer in response to the gesture being no longer identified. The control object can be a hand of the user. The gesture can include a cupped hand of the user placed in proximity to an ear of the user and the mimicking the effect can include increasing an amplitude of the sound. The system can further include a gaze-tracking sensor configured to enable determination of a direction of a gaze of the user. The one or more processors can be configured to determine, using the gaze-tracking sensor, one or more objects within an area of an environment that the user is gazing upon and determine an angle of deflection between one or more fingers of the user and a corresponding palm of the hand of the user when the hand of the user is cupped. The size of the area can be determined based on the angle of the deflection of the one or more fingers.

The environment can be a virtualized environment. The gesture can include at least partially covering an ear of the user and the mimicking the effect can include decreasing an amplitude of the sound. The effect can be a first effect in response to the gesture being identified as the hand being formed and located to imitate plugging an ear canal of the user with a digit of the hand and a second effect, different from the first effect, in response to the gesture being identified as the hand being formed to imitate covering the ear canal with a palm of the hand. The system can further include a pressure sensor. The one or more processors can be configured to determine a magnitude of pressure applied by the hand of the user to the pressure sensor. The sound can be generated mimicking the effect based on the magnitude of the pressure. The generating the sound can include independently generating a respective sound for a left ear of the user and a right ear of the user depending on a location of the control object in relation to the left ear or the right ear when performing the gesture.

The one or more processor can be configured to generate the sound corresponding to an object selected from within an environment by either: tracking a gaze of the user; or identifying a gesture of the user selecting the object. In response to a first gesture being identified, the sound can be generated for a first set of objects within an environment without affecting sound generated by a second set of objects in the environment. In response to a second gesture being identified, the sound can be generated for a third set of objects within the environment, the third set of objects being different from the first set of objects and the second set of objects. The system can include a head-mounted display. The one or more sensors can be mounted to the head-mounted display. The one or more sensors can include a contact sensor configured to determine contact between the control object and the head-mounted display.

In certain embodiments, a method is disclosed. The method can include identifying, using one or more sensors, a gesture performed by a user via the control object, wherein the gesture is a gesture performed to modify sound waves travelling toward the user's ear, the modification caused by interaction of the sound waves with the control object. The method can also include generating, by one or more processors, a first signal based on the identifying the gesture. The method can further include either (1) generate a sound that mimics an effect of the modification to the sound waves by the control object via the gesture; or (2) ceasing to generate a sound to mimic an effect of the modification to the sound waves by the control object via the gesture.

The one or more sensors are mounted to a head-mounted display. The method can also include selecting an object from within an at least partially virtualized environment displayed to the user via the head-mounted display, the object selected by either tracking a gaze of the user or identifying a gesture of the user selecting the object. The sensor can include a contact sensor configured to determine contact between the control object and the head-mounted display. The head-mounted display can be configured to display a virtualized environment to the user. The sound can be generated for an object viewed by the user in the virtualized environment.

In certain embodiments, an apparatus is disclosed. The apparatus can include a means for identifying a gesture performed by a user via the control object, wherein the gesture is a gesture performed to modify sound waves travelling toward the user's ear, the modification caused by interaction of the sound waves with the control object. The apparatus can also include a means for generating a first signal based on the identifying the gesture. The apparatus can further include a means for transmitting the first signal to a means for generating sound, the first signal causing the means for generating sound to (1) generate a sound mimicking an effect of the modification to the sound waves by the control object via the gesture; or (2) cease generating a sound to mimic an effect of the modification to the sound waves by the control object via the gesture.

The apparatus can further include a means to display an environment to the user, wherein the sound is generated for an object within an environment displayed on the means to display. The apparatus can also include a means to select an object from within the environment by either tracking a gaze of the user; or identifying a gesture of the user selecting the object. The means for identifying the gesture can include a proximity sensor configured to determine proximity between the control object and an ear of the user. The environment can be a virtualized environment.

In certain embodiments, disclosed is a non-transitory, computer readable medium storing instructions that, when executed by the one or more processors, cause the one or more processors to identify, using the one or more sensors, a gesture performed by a user via the control object, wherein the gesture is a gesture performed to modify sound waves travelling toward the user's ear, the modification caused by interaction of the sound waves with the control object. The instructions can further cause the one or more processors to generate a first signal based on the identifying the gesture. The instructions can also cause the one or more processors to transmit the first signal to the transducer, the first signal causing the transducer to (1) generate a sound that mimics an effect of the modification to the sound waves by the control object via the gesture; or (2) cease generating a sound to mimic an effect of the modification to the sound waves by the control object via the gesture.

The one or more sensors can be mounted to a head-mounted display. The instructions, when executed by the one or more processors, can cause the one or more processors to select an object from within an environment displayed to the user via the head-mounted display, the object selected by either tracking a gaze of the user or identifying a gesture of the user selecting the object. The one or more sensors can include a contact sensor configured to determine contact between the control object and the head-mounted display. The instructions, when executed by one or more processors, cause the one or more processors to display, via the head-mounted display, a virtualized environment to the user.

BRIEF DESCRIPTION OF THE DRAWINGS

Aspects of the disclosure are illustrated by way of example. In the accompanying figures, like reference numbers indicate similar elements.

FIG. 1 illustrates a simplified diagram of a head mounted display worn by a user;

FIG. 9 illustrates a simplified flowchart of an apparatus of the disclosure, according to certain embodiments;

DETAILED DESCRIPTION

Figure 2:
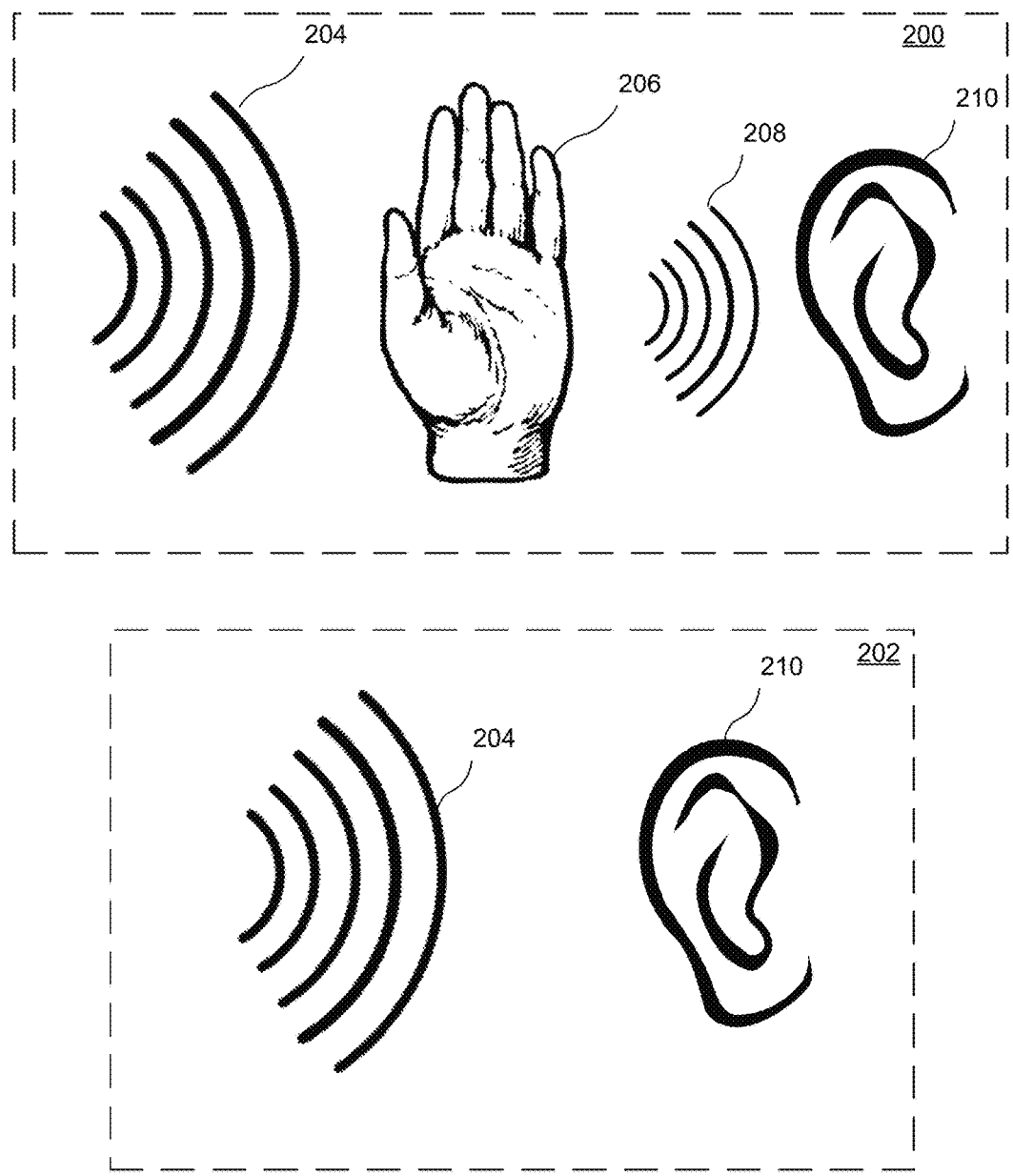
FIG. 2 illustrates features of the disclosure pertaining to gestures for audio control.

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Audio controls can take many different shapes and forms. Physical knobs and switches can be used to alter one or more aspects of audio generated by a device. For example, volume can be controlled by a rotational knob, a slider, a momentary contact switch, or other controls. Various other controls can be used to alter various aspects of audio generated by a device. For example, balance, fade, equalization settings, line level controls, application of filter(s), or other such aspects of audio can be controlled via switches or other physical controls. While control schemas using physical switches may be appropriate for physical audio generating devices (e.g., mixers, stereos, smartphones, televisions, etc.), they may be difficult or unintuitive for a virtualized environment.

Virtualized environments (e.g., augmented or virtualized environments) can be generated and presented to a user to, for example, provide an immersive environment and/or to supplement real world interactions with a physical environment. Virtualized environments can include presenting virtualized video and/or audio representations of objects within the virtualized environment. The objects may be virtual objects. For example, a virtual stereo, speaker, animal, television, or any other object can be virtualized and presented to a user with corresponding video and/or audio. A user can interact with a virtualized environment in various ways. For example, a user can utilize gestures to modify certain aspects of the virtualized environment. As one example, a user may virtually "touch" a virtual computer screen to select certain programs (e.g., spreadsheets, word processors, etc.) to interact with. In a virtualized environment, many differing gestures or other control schemas can be implemented. For example, a user may be presented with a remote control with physical switches, a user may utilize voice commands, a user may utilize controls mounted to a head mounted display, a user may interact with virtual switches, or any combination of the preceding.

As such, many different options may exist to control audio within a virtualized environment. However, certain controls, such as those modeled after physical audio controls, may be cumbersome and/or unintuitive. For example, as virtualized environments become more realistic and immersive, users may attempt to interact with the virtualized environment as they would with a physical, real-life environment. A user may therefore attempt to modify audio generated within the audio environment utilizing familiar gestures and/or actions that would modify sound(s) generated by a corresponding real-life object.

Disclosed are techniques to implement intuitive gesture-based audio controls. The controls can be used within a virtualized environment to control various aspects of audio generated for the virtualized environment. For example, a user may cover their ears to attempt to mute or decrease a volume of audio that is generated for the environment. The gesture of covering the ears can be interpreted by a computer system and a volume of audio generated for the environment decreased. The decrease in audio in the virtualized environment can mimic effects that would occur in a real-life physical environment if the user were to cover their ears. Various other gestures are also disclosed. For example, a user may plug their ear(s) with their fingers to decrease an audio volume or cup their hands in proximity to their ear(s) to enhance an audio volume.

Audio can be encoded using various techniques. One technique involves the use of channel based audio encoding wherein each channel corresponds to a speaker/transducer used to generate sound waves. For example, 5.1 audio systems can be implemented that include 5 speakers and one subwoofer. Different audio can be encoded and provided to each of the five speakers and one subwoofer. Such a system may lack flexibility regarding different speaker configuration (e.g., different numbers of channels, physical location of speakers, types of speakers, etc.). Alternative audio encoding techniques can include object based audio encoding or use of ambisonics. In object based audio encoding, audio "objects" can be defined in three-dimensional space. The objects can include audio information, directional information, etc. By defining audio objects, an audio processor can determine, based on a particular speaker setup, how best to distribute audio between speakers to represent various audio objects as they are positioned with respect to a user. Ambisonics is a similar speaker-independent technique wherein audio is defined with respect to a spherical surround plane. Thus, using both ambisonic and audio object techniques, audio can be encoded in a manner that is independent of a particular speaker setup. Audio object encoding techniques can further provide more granularity by providing audio information for audio objects within a scene as compared to ambisonic or channel based audio encoding techniques.

Object based audio encoding techniques can provide several advantages when used in a virtualized environment. For example, various virtualized objects can have assigned corresponding audio information. For example, a virtual telephone may ring (emit a ringing sound) to indicate that a call is received. The virtual object may also have a corresponding audio setting which may be adjustable. Using audio object based encoding techniques, the virtual object (e.g., telephone) can be treated as a separate audio object that can be controlled independently from remaining audio objects. Furthermore, the position of the audio object with respect to a user can be tracked. Thus, as the user interacts with and/or moves with respect to the object, the audio for the object can be independently adjusted from other audio objects and/or background audio.

In certain embodiments, the gesture detection techniques can be integrated with gaze detection and/or other techniques that can be used to select one or more objects within a virtualized environment for corresponding control of audio. For example, a user may look at a virtualized speaker and cover their ears to modify audio generated corresponding to the virtualized speaker. In certain embodiments, a head-mounted display can be utilized to detect gestures utilizing integrated sensor(s), such as imaging, pressure, contact, or other sensor(s). In certain embodiments, gestures can be used to adjust audio in a non-virtualized environment. For example, a user listening to music from a smartphone or other portable device can adjust audio generated by the device utilizing the gestures. In certain embodiments, user gesture(s) can be detected by a remote sensor. For example, a user may be within a movie theater that utilizes personalized audio generation and the user can modify the personalized audio generated for the user using the disclosed techniques. The gestures can, for example, be detected by an imaging or other sensor.

FIG. 1 illustrates a simplified diagram embodying several features of the disclosure. FIG. 1 illustrates a system 100 that can be used to present generated audio and/or virtualized image(s) to a user 102. As illustrated, user 102 can wear a head-mounted display 104 with integrated audio generation device(s) 108 (e.g., a speaker or transducer). In certain embodiments, user 102 may interact with a virtualized or physical environment without use of a head-mounted display. For example, user 102 can be presented with a virtualized environment via external display(s) (not illustrated). User 102 can interact with a virtualized environment utilizing, for example, the user's hand 112 or other control objects.

Head-mounted display 104 can include integrated displays 106 that may present virtual or augmented images to user 102. Head-mounted display 104 can also include a sensor 110. Sensor 110 can include an imaging, orientation, contact, or other sensor that may be used to detect movement, position, or configuration of a control object used, by user 102, to perform a gesture and/or to determine appropriate information to display to user 102 via displays 106. In certain embodiments, sensor 110 can be used to determine a gesture performed by hand 112 or another control object (such as an appendage or an object carried by a user). Example control objects can include a glove, game controller, wand, etc. For example, image tracking and analysis techniques can be used to identify various gesture(s) performed by hand 112. Sensor 110 may include a contact, pressure, or proximity sensor to detect physical direct contact between hand 112 and head-mounted display 104.

Although not illustrated, head-mounted display 104 may include a controller and/or be in communication with a controller. The controller can be operable to process information gathered via sensor 110. The information can indicate movement, position, or configuration of a control object. The controller can, using the information, make a determination if an appropriate gesture has been performed by user 102 and modify audio generated by audio generation device(s) 108. The controller may also be used to interrupt information from sensor 110 to, for example, determine an orientation or a field of view of user 102 and generate corresponding virtualized video or audio accordingly. The controller may also be operable to determine a direction of a gaze of user 102, as disclosed herein.

Head-mounted display 104 may include one or more gaze tracking sensors (not illustrated) that may be used to determine a direct that user 102 is gazing. For example, a determination can be made that user 102 is directing their gaze towards object 114, as indicated by arrow 116. Object 114 can be a virtual object or a physical object. In certain embodiments, combining gaze detection with gesture detection can be used to select one or more objects for audio control. For example, object 114 can be a virtual speaker. User can gaze at object 114 to select object 114 for audio control via one or more gestures. In certain embodiments, object 114 can be a physical object. For example, object 114 can be a newspaper and audio can be generated to speak the text contained therein and/or to supplement the text. Gestures may be used to alter the audio generated for the newspaper.

FIG. 2 illustrates a simplified diagram embodying several features of the disclosure regarding gesture recognition. Illustrated are two different states (200 and 202) wherein a sound wave 204 may be incident upon an ear 210 of a user (user 102, for example). States 200 and 202 are provided to illustrate effects of audio in a real-world physical environment without use of virtually generated audio. As illustrated by state 202, sound wave 204 may be unobstructed prior to entering ear 210 (or an ear canal) of the user. Sound wave 204 can be generated by a drum, passing car, bird, or any other physical object.

In state 200, hand 206 (which can be hand 112) can affect sound wave 204 prior to sound wave 204 entering ear 210 of the user. As illustrated, sound wave 204, due to interaction with hand 206, can be minimized or otherwise altered to form sound wave 208. Sound wave 208 may then enter ear 210 and provide a different acoustical signature to the user as compared to sound wave 204 that is not hindered by hand 206. In certain embodiments, sound wave 204 may be blocked completed and prevented from entering ear 210. Examples of the modification of sound wave 204 can include a user covering their ear(s) with a hand, plugging their ear(s) with finger(s), and cupping their hands to focus or enhance audio received by ear 210.

As illustrated in FIG. 2, a physical object, such as hand 206, can have a physical effect on sound wave(s), such as sound wave 204. If a user were to hear an uncomfortably loud sound, the user may instinctively cover their ears to attempt to muffle the loud sound. However, in a virtualized environment, audio may be provided by a transducer in proximity to a user's ear. For example, audio generation device 108 may be headphone-like transducer that covers an ear of a user. The transducer may generate audio for a variety of objects in a virtualized or other environment, as disclosed herein. For example, although a user may be looking at a virtualized loud car, the corresponding audio may be generated in relatively close proximity to the user. As such, a user covering their ears in a virtualized environment may not have a physical effect on audio generated for the virtualized environment.

The disclosed techniques can be used to mimic effects of modifying audio by a hand or other control object. For example, a user may cover their ears while immersed in a virtualized environment. Using the techniques disclosed herein, covering of the ears can be interpreted as a gesture and generated audio adjusted accordingly. For example, the previously mentioned audio for the virtualized loud car can be muffled upon detecting an appropriate gesture. The muffling (or other effects) of the audio can mimic effects that a user may experience if performing the corresponding gesture in a physical/real world when the gesture would physically modify sound wave(s).

Figure 3:
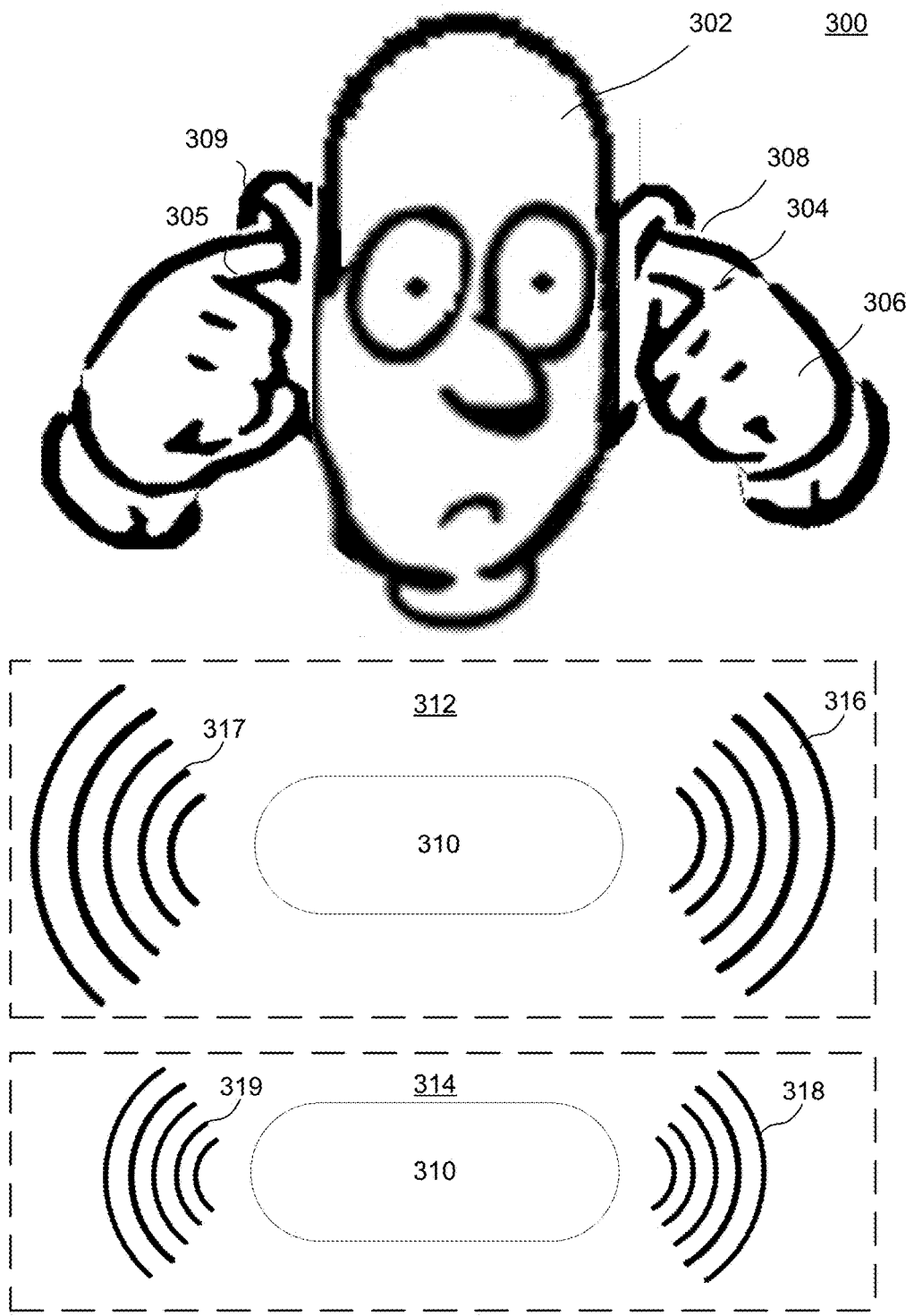
FIGS. 3-5 illustrate various example gesture and corresponding audio controls, according to embodiments of the disclosure.

FIG. 3 illustrates a simplified diagram 300 embodying several features of the disclosure regarding gesture recognition. In FIG. 3, user 302 (that can be similar to user 102) is performing a gesture with hand 306 (that can be similar to hand 112) of inserting finger 304 into ear 308 of user 302. A notional object 310 is illustrated that can be a virtualized or physical object, as disclosed herein. As should be understood, the act of inserting finger 304 into ear 308 of user 302 can have a physical effect on audio in a real world environment. For example, audio heard by user 302 may be muffled, volume/amplitude decreased, or otherwise modified. As disclosed herein, in a virtualized environment, such a gesture may have little effect on physically produced audio sound waves generated for the virtualized environment.

Using the techniques disclosed herein, the gesture of attempting to insert digit 304 into ear 308 of user 302 can be interpreted as a gesture to modify audio within a virtualized, or other, environment. For example, state 312 of object 310 can correspond to a state wherein digit 304 is not inserted into ear 308. As such, audio 316 generated corresponding to object 310 can be in state 312. State 314 of object 310 can correspond to a state wherein digit 304 is inserted into ear 308. As such audio 318 generated corresponding to object 310 can be modified, as illustrated. For example, audio 318 can have a decreased volume and/or amplitude as compared to audio 316. In certain embodiments, object 310 can correspond to an audio object and states 312 and 314 can correspond to respective states of the audio object corresponding to object 310. In certain embodiments, a filter can be applied to form audio 318, such as a low-pass or other filter to allow certain frequencies of audio to pass or be modified when a corresponding gesture is identified. When a gesture is no longer detected, audio for object 310 can return to state 312. Thus, the gesture of inserting a finger 304 into or in proximity to ear 308 can be interpreted to perform a modification of generated audio to mimic physical effects of audio distortion or modification caused by inserting a finger 304 into ear 308 in a real-world environment.

As disclosed herein, audio for a virtualized environment can be generated by one or more transducers located in proximity to ear 308 of user (such as using a headphone or head-mounted display 104, for example). As such, finger 304 may not be able to be inserted into ear 308 of user 302 while wearing a head-mounted transducer. However, a gesture can be detected wherein finger 304 is in proximity to ear 308, even though finger 304 may be inhibited from entering an ear canal. For example, a contact or other sensor, as disclosed herein, can be used to detect contact between finger 304 and a head-mounted transducer system and a corresponding modification of generated audio performed, as disclosed with respect to FIG. 3.

In certain embodiments, gestures pertaining to a left ear 308 and right ear 309 may be independently identified. For example, audio generated for left ear 308 (such as 316 and 318) can be independently generated and/or modified as compared to audio generated for right ear 309 (such as 317 and 319). For example, a digit 305 inserted into right ear 309 can cause substantial modification to audio 319 corresponding to right ear 309. As should be understood, due to the nature of virtualized audio generation, a gesture of inserting a digit into or in proximity to an ear can mute all audio, certain audio, or apply a certain filter independently to a gesture of inserting a digit into another ear. Thus, various combination of audio generation/modification in response to gesture(s) are possible and contemplated to be within the scope of the disclosure. Such features, such as independent control of audio generated for left and right ears can be incorporated into the various gestures disclosed herein.

Figure 4:
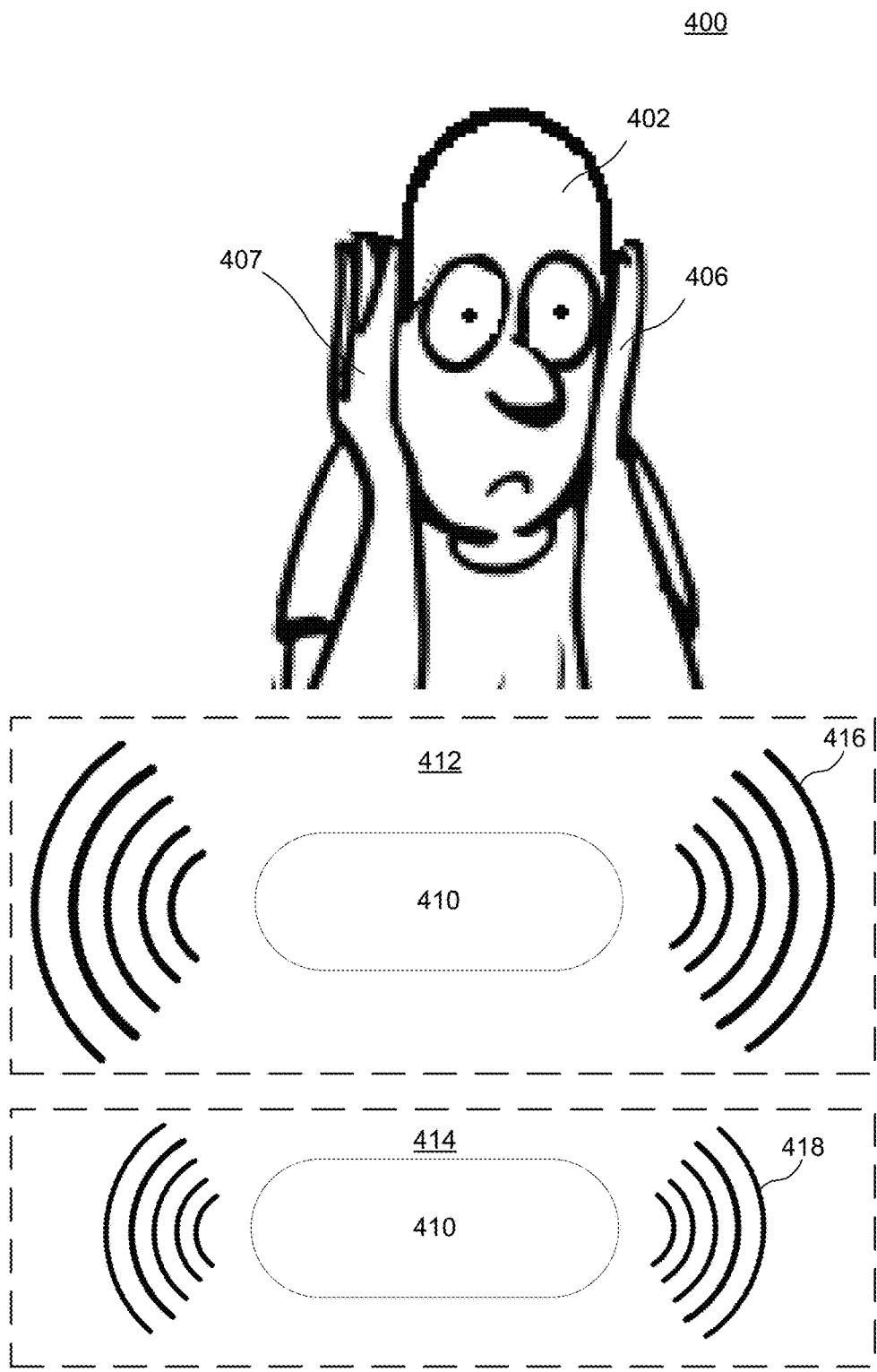

FIG. 4 illustrates a simplified diagram 400 embodying several features of the disclosure regarding gesture recognition. In FIG. 4, user 402 (that can be similar to user 102) is performing a gesture with left hand 406 and right hand 407 (that can each be similar to hand 112) of covering ears of user 402. A notional object 410 is illustrated that can be a virtualized or physical object as disclosed herein. As should be understood, the act of covering ear(s) of user 402 with hand(s) 407 and/or 406 can have a physical effect on audio in a real world environment. For example, audio heard by user 402 may be muffled, volume/amplitude decreased, or otherwise modified. As disclosed herein, in a virtualized environment, such a gesture may have little effect on physically produced audio sound waves generated for the virtualized environment.

Using the techniques disclosed herein, the gesture of covering ear(s) of user 402 with hand(s) 407 and/or 406 can be interpreted as a gesture to modify audio within a virtualized, or other, environment. For example, state 412 of object 410 can correspond to a state wherein ear(s) of user 402 are not covered by hand(s) 407 and/or 406. As such, audio 416 generated corresponding to object 410 can be in state 412. State 414 of object 410 can correspond to a state wherein ear(s) of user 402 are covered by hand(s) 407 and/or 406. As such, audio 418 generated corresponding to object 419 can be modified, as illustrated. For example, audio 418 can have a decreased volume and/or amplitude as compared to audio 416. In certain embodiments, object 410 can correspond to an audio object and states 412 and 414 can correspond to respective states of the audio object corresponding to object 410. In certain embodiments, a filter can be applied to form audio 418, such as a low-pass or other filter to allow certain frequencies of audio to pass or be modified when a corresponding gesture is identified. When a gesture is no longer detected, audio for object 410 can return to state 412. Thus, the gesture of covering ear(s) of user 402 with hands 407 and/or 406 can be interpreted to perform a modification of generated audio to mimic physical effects of audio distortion or modification caused by covering ear(s) of user 402 with hands 407 and/or 406 in a real-world environment.

The gesture(s) of FIG. 4 can have a substantially similar effect as the gesture(s) of FIG. 3 or can have a different effect. For example, certain audio generated for a virtualized environment can be designated as ambient noise. The ambient noise may be generated as background noise and may not correspond with virtual of physical object(s). Performing the gesture illustrated by FIG. 3 can mute or diminish audio corresponding to virtual and/or physical objects but may allow ambient noise to remain unaltered whereas performing the gesture illustrated by FIG. 4 may mute or diminish all generated audio (or vice-versa). As another example, performing the gesture illustrated in FIG. 3 may apply a high-pass filter and allow relatively low frequency noise to pass whereas performing the gesture illustrated in FIG. 4 may mute all noise (or vice-verse). Thus, performing the gesture of FIG. 3 can be interpreted as performing different audio control action(s) as compared to performing the gesture of FIG. 4 and may therefore apply differing audio effects.

Figure 5:
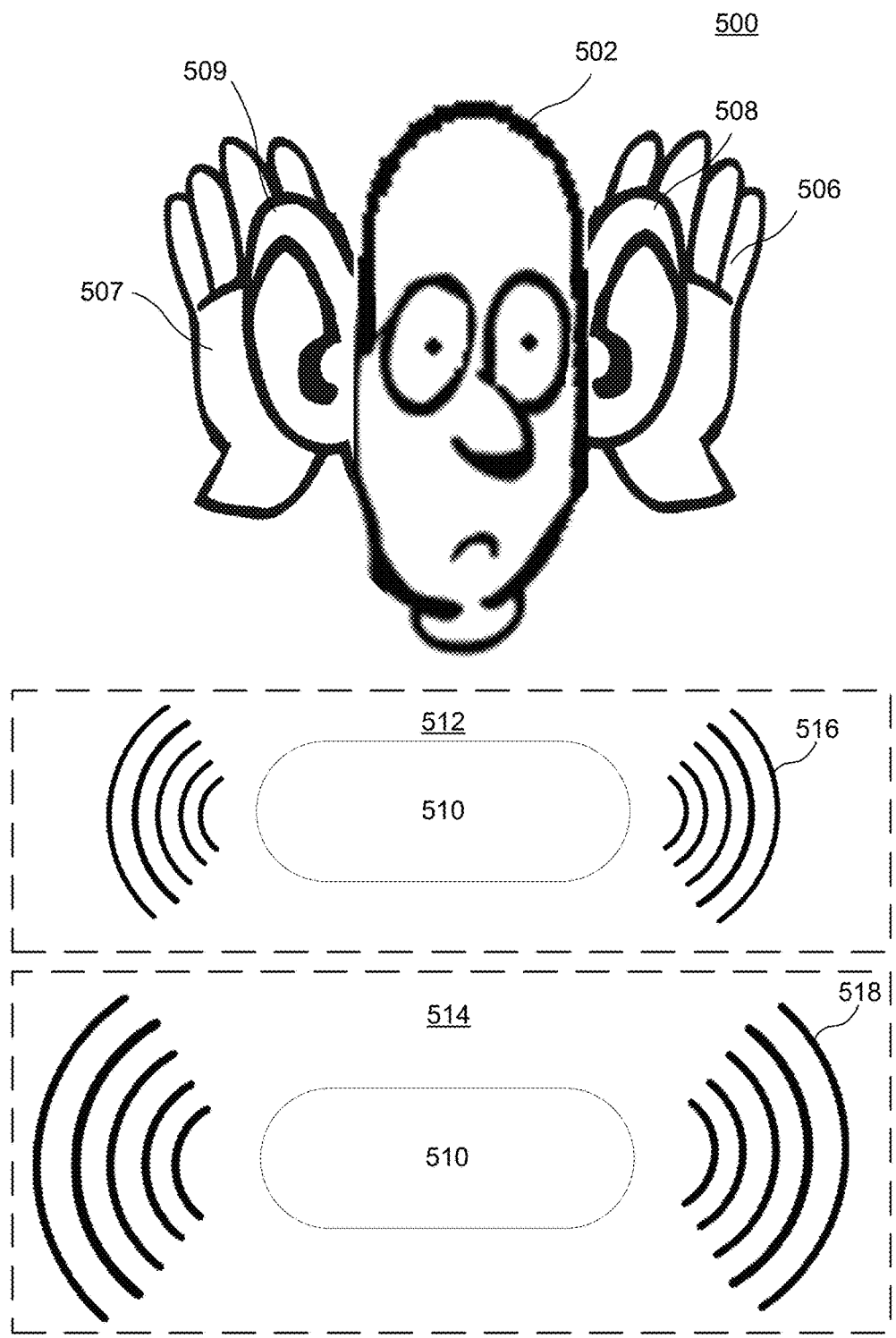

FIG. 5 illustrates a simplified diagram 500 embodying several features of the disclosure regarding gesture recognition. In FIG. 5, user 502 (that can be similar to user 102) is performing a gesture of cupping left hand 506 and right hand 507 (that can each be similar to hand 112) respective in proximity of ears 508 and 509 of user 502. A notional object 510 is illustrated that can be a virtualized or physical object as disclosed herein. As should be understood, the act of cupping hand(s) 506 and/or 507 in proximity of ear(s) 508 and 509 can have a physical effect on audio in a real world environment. For example, audio heard by user 502 may be attenuated, enhanced, or otherwise modified. As disclosed herein, in a virtualized environment, such a gesture may have little effect on physically produced audio sound waves generated for the virtualized environment.

Using the techniques disclosed herein, the gesture of cupping hand(s) 506 and/or 507 in proximity of ear(s) 508 and 509 can be interpreted as a gesture to modify audio within a virtualized, or other, environment. For example, state 512 of object 510 can correspond to a state wherein hand(s) 506 and/or 507 are not cupped in proximity to ear(s) 508 and/or 509 of user 502. As such, audio 516 generated corresponding to object 510 can be in state 512, as illustrated. State 514 of object 510 can correspond to a state wherein hand(s) 506 and/or 507 are cupped in proximity to ear(s) 508 and/or 509. As such audio 518 generated corresponding to object 510 can be modified, as illustrated. For example, audio 518 can have an increased volume and/or amplitude as compared to audio 516. In certain embodiments, a filter can be applied to form audio 518 to allow certain frequencies of audio to pass or be modified when a corresponding gesture is identified. When a gesture is no longer detected, audio for object 510 can return to state 512. Thus, the gesture of cupping hand(s) 506 and/or 507 in proximity of ear(s) 508 and 509 can be interpreted to perform a modification of generated audio to mimic physical effects of audio distortion or modification caused by cupping hand(s) 506 and/or 507 in proximity of ear(s) 508 and 509 in a real-world environment. In certain embodiments, object 510 can correspond to an audio object and states 512 and 514 can correspond to respective states of the audio object corresponding to object 510.

As disclosed herein, any of the gestures illustrated in FIGS. 3-5 can be implement in conjunction with gaze tracking or other techniques to select object(s) within a virtualized environment for audio control and/or modification. For example, any of the objects 310, 410, and/or 510 can be controlled with corresponding gesture(s) in the manners described wherein any of objects 310, 410, and/or 510 can be selected via a gaze or other means. For example, a user may perform a gesture of pointing to object(s) with one hand to select the object(s) and may perform a gesture disclosed herein with their other hand to control audio. Objects 310, 410, and/or 510 can correspond to respective audio objects which can be selected for audio control and/or modification using the disclosed gaze or other techniques for selecting object(s) within a virtualized environment.

Figure 6:
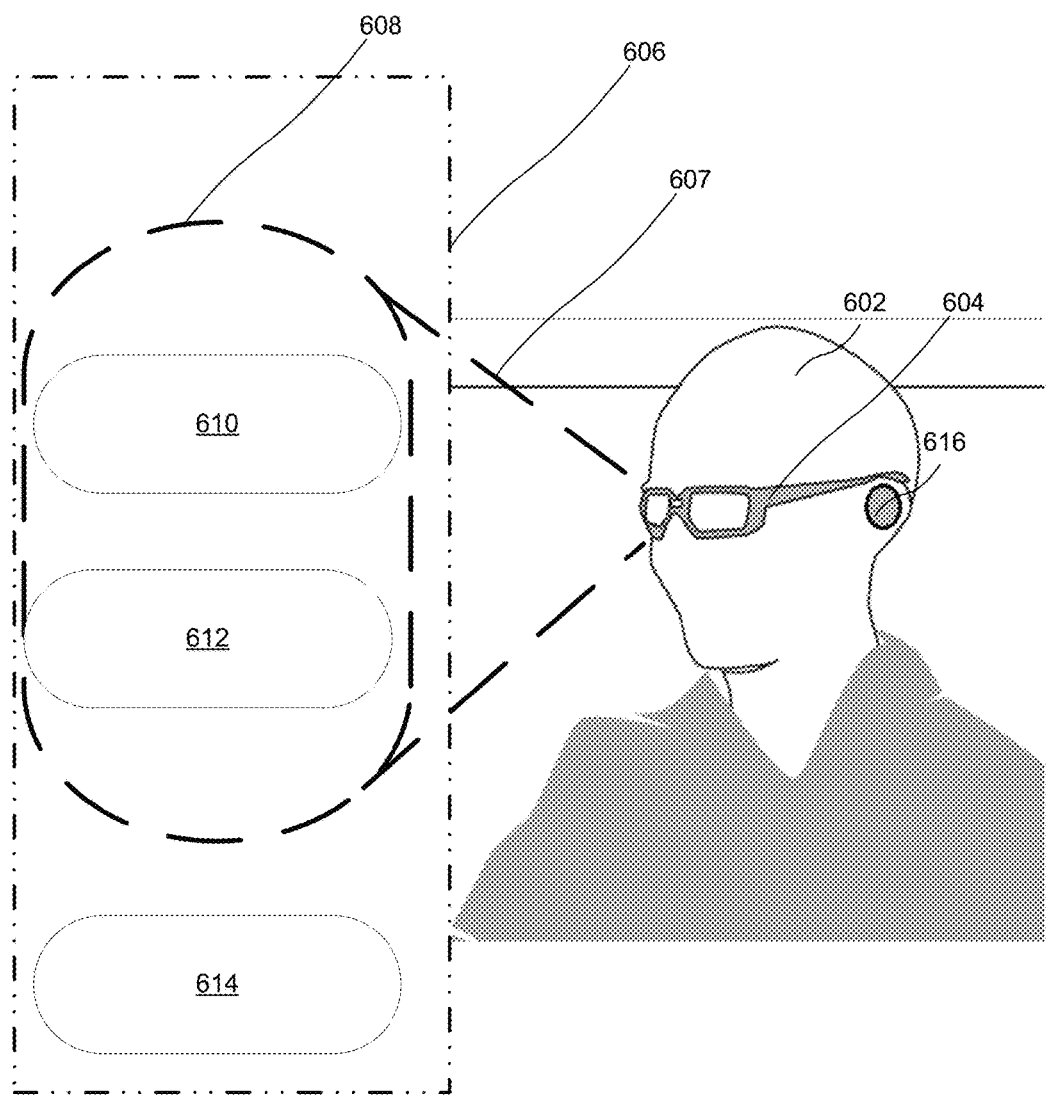
FIGS. 6 and 7 illustrate features of the disclosure pertaining to object selection for audio control.

FIG. 6 illustrates various features of certain embodiments pertaining to the aforementioned object selection techniques. As illustrated, user 602 can wear a head-mounted display 604 (that can be similar to head-mounted display 104) that can include an audio generation device 616, such as a transducer. As disclosed herein, various other external systems can be used to generate audio and/or video information, such as a large screen external display and/or external audio generation devices. As illustrated, user 602 can view an environment 606 containing various objects 610, 612, and 614. Environment 606 can be a physical environment, an augmented-reality environment, or a virtual-reality environment. As disclosed herein, various audio effects can be produced by audio generation device 616 that can mimic audio generated by or otherwise corresponding to objects 610, 612, and/or 614.

As disclosed herein, user 602 can manipulate audio pertaining to environment 606 through use of various gestures, such as the gestures illustrated in FIGS. 3-5. Objects 610, 612, and/or 614 can be similar to objects 310, 410, or 510. Thus, when user 602 performs any of the gestures illustrated in FIGS. 3-5, audio corresponding to objects 610, 612, and/or 614 can be generated and/or modified as disclosed herein with regards to FIGS. 3-5. Selection of which of objects 610, 612, and/or 614 to generate or modify audio for can be determined using various techniques, such as gaze detection or gesture detection. For example, as illustrated, a field of view 607 can be determined for a user and a corresponding region of interest 608 projected into environment 606. If objects(s) are within region of interest 608, then audio can be generated and/or modified according to the correspondingly performed gesture. In certain embodiments, user 602 can point to, draw an outline around, or use an external controller (such as a 3D remote control) to select objects for audio control corresponding to the disclosed gesture(s). Gaze tracking can be determined using a sensor, such as a sensor integrated within head-mounted display 604 or a sensor viewing user 602, for example.

Figure 7:
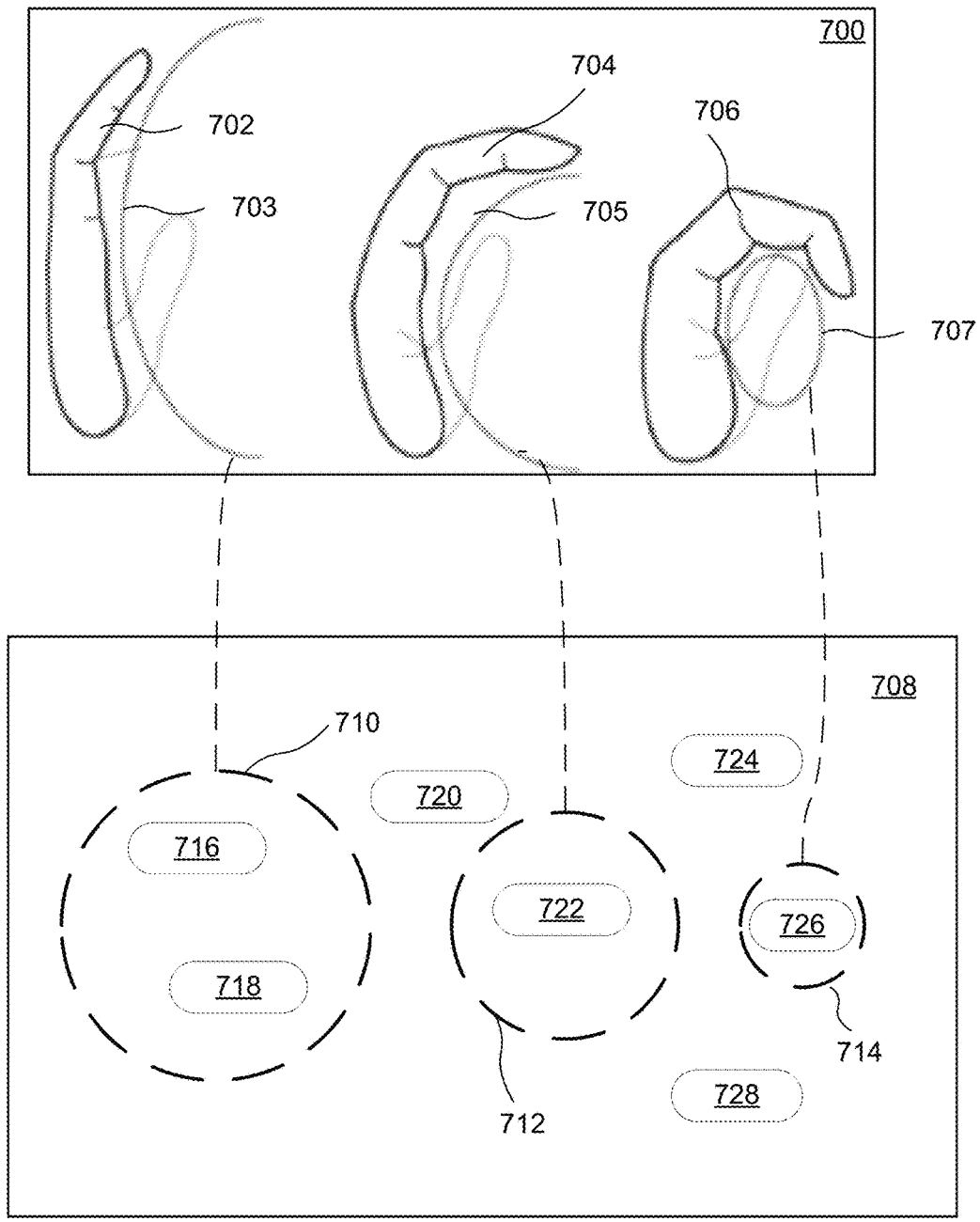

FIG. 7 illustrates a simplified diagram embodying several features of the disclosure regarding gesture recognition. Illustrated are several hand shapes/gestures 700 that can be performed using a hand of a user (such as hand 112). As illustrated, the hand can be cupped with a digit extended at various different angles compared to a plane formed by the palm of the hand. For example, in order from 702, 704, and to 706, the angle between the corresponding finger and the plane is decreasing. As illustrated, a progressively smaller diameter circular shape (703, 705, and 707) can be formed by the contour of the finger and palm. The illustrated gestures 700 can be formed when, for example, a user is cupping their hand as illustrated in FIG. 5. A user may also form the gesture illustrated to form an outline around an object (e.g., by locating the hand in the field of view of the user in a position that one of shapes 703, 705, or 707 includes the desired object).

Illustrated is an environment 708 that can include various objects 716-728. Objects 716-728 can each be a virtual object or a physical object. Illustrated are regions of interest 710, 712 and 714 that can be each respectively correspond to one of shapes 703, 705, or 707. As illustrated, the diameters of the regions of interest 710, 712, and 714 decrease as corresponding finger 702, 704, and 706 angles decrease. As disclosed herein, regions of interest 710, 712, and/or 714 can be used to select from between objects 716-728 to implement corresponding audio control. For example, region of interest 710 is illustrated as circumventing objects 716 and 718. As such, objects 716 and 718 may be selected for audio control. Similarly, object 722 may be selected by region of interest 712 and object 726 may be selected by region of interest 714.

Figure 8:
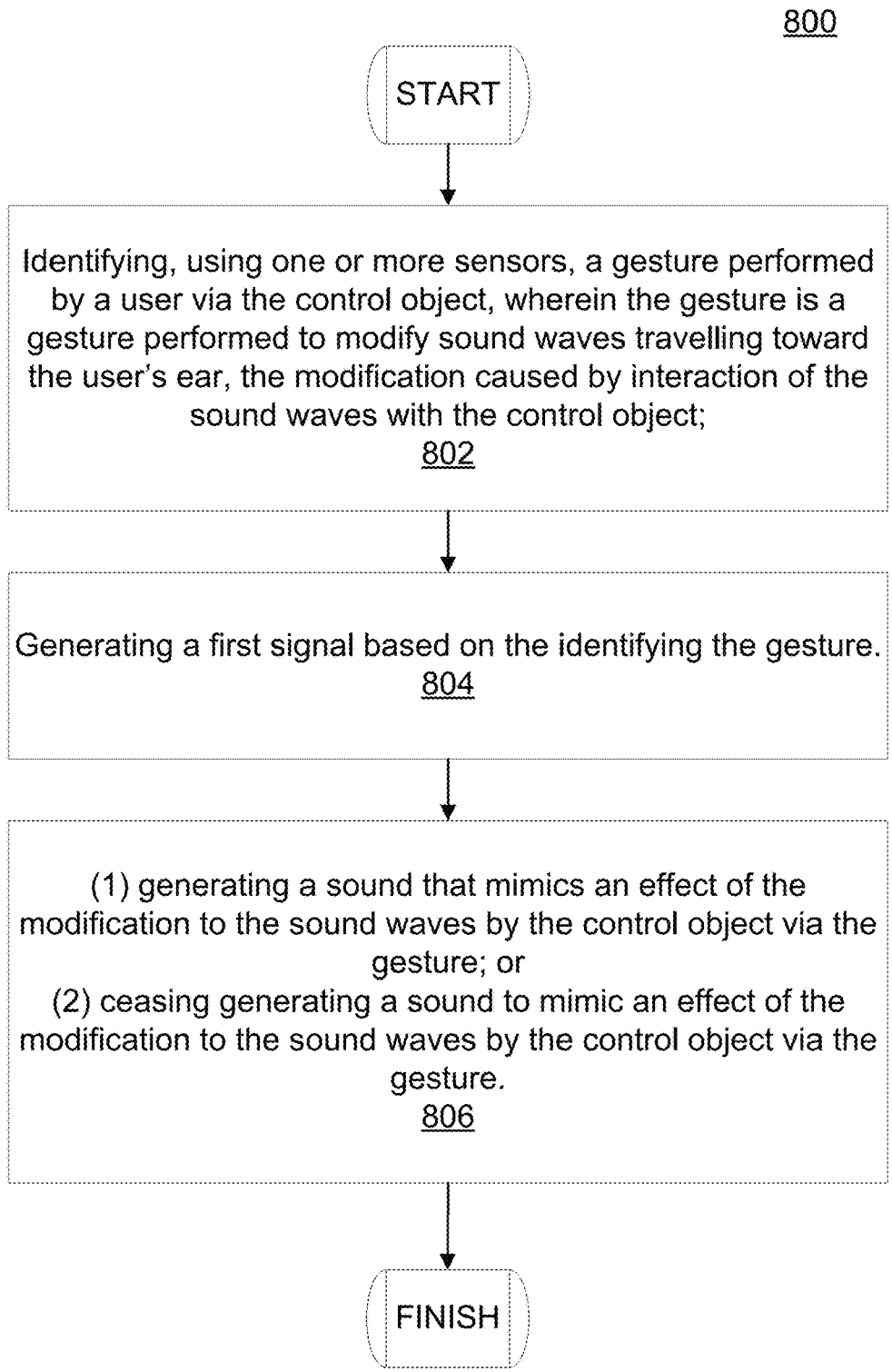
FIG. 8 illustrates a simplified flowchart of a method of the disclosure, according to certain embodiments.

FIG. 8 illustrates a flowchart 800 for implementing techniques using certain embodiments. At 802, a gesture can be identified that is performed by a user via the control object, wherein the gesture is a gesture performed to modify sound waves travelling toward the user's ear, the modification caused by interaction of the sound waves with the control object. For example, the gestures of FIGS. 3-5 are example gestures that can be detected using the various sensors and techniques disclosed herein, such as via head-mounted display 104. At 804, a first signal based on the identifying the gesture. At 806 a sound can be generated that mimics an effect of the modification to the sound waves by the control object via the gesture or a sound can be ceased from being generated to mimic an effect of the modification to the sound waves by the control object via the gesture For example, amplitude(s) of sounds can be increased or decreased as disclosed herein, filter(s) can be applied, or other attributes of the sound can be altered.

Figure 10:
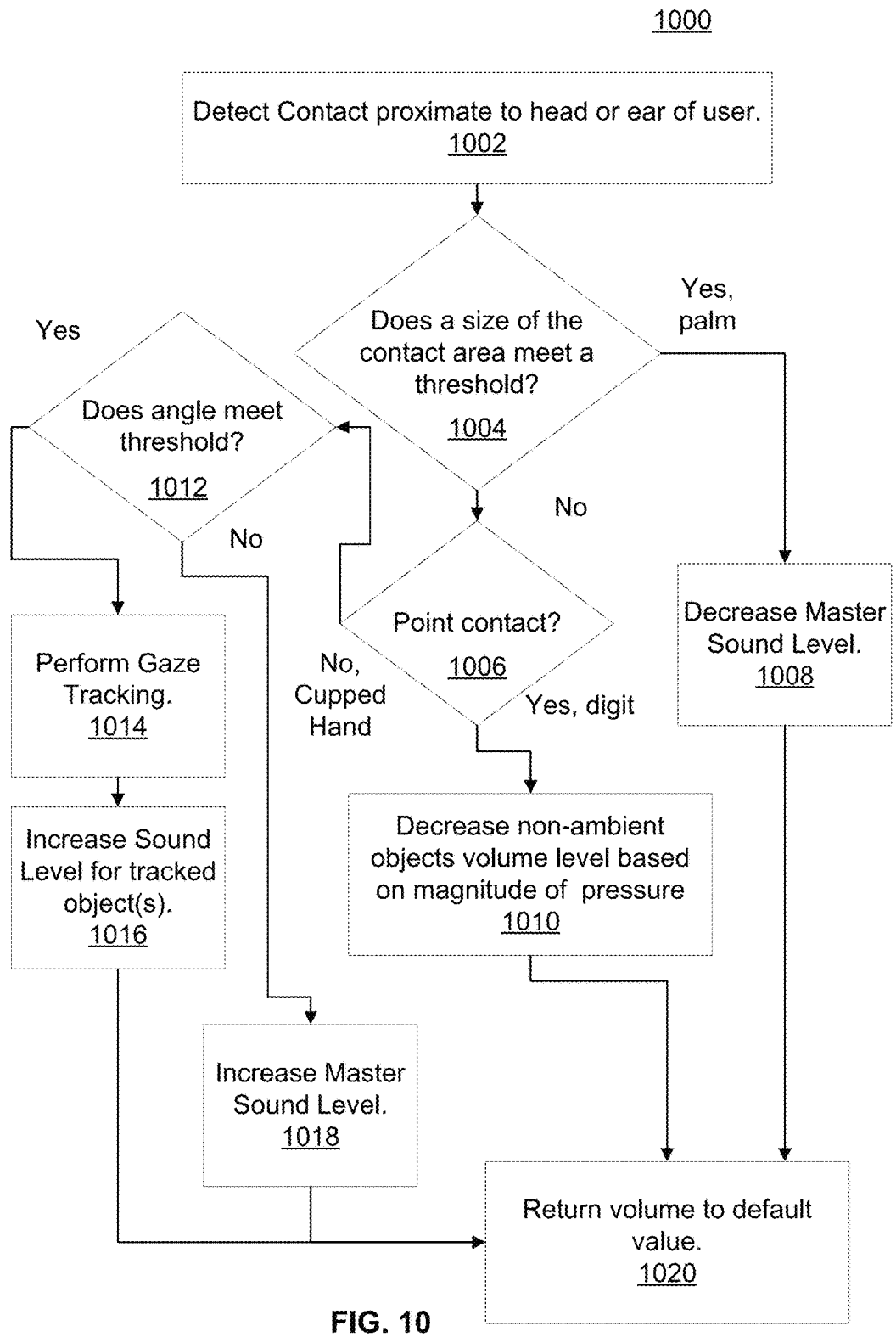
FIG. 10 illustrates a simplified flowchart of certain features of the disclosure.

FIG. 9 illustrates a data flow diagram 900 for implementing techniques using certain embodiments. At 902 is a means for identifying a gesture performed by a user via the control object, wherein the gesture is a gesture performed to modify sound waves travelling toward the user's ear, the modification caused by interaction of the sound waves with the control object. The controllers disclosed herein in conjunction with sensor(s) (e.g., sensor 110) are example means for performing the identifying. At 904 is a means for generating a first signal based on the identifying the gesture, which may also be a controller. At 906 is a means for transmitting the first signal, which can be a transmitter or transceiver coupled between a controller and a transducer. At 908 is a means for generating sound. Audio generation device 108 (e.g., a speaker or transducer) is an example means for generating the sound. The means for generating sound can receive the first signal and, in response to receiving the first signal, generate a sound that mimics an effect of the modification to the sound waves by the control object via the gesture; or cease generating a sound to mimic an effect of the modification to the sound waves by the control object via the gesture FIG. 10 illustrates a flowchart 1000 for implementing techniques using certain embodiments. At 1002 a contact proximate to head or ear of user can be detected. For example, contact be detected by a proximity sensor or contact sensor mounted to head-mounted display 104. At 1004, a determination can be made if the contact area meets a threshold. If so, then the gesture can be identified as a palm gesture, such as the gesture identified in FIG. 4. In response, at 1008, a master sound level can be decreased. If the contact does not meet the threshold, then at 1006, a determination can be made if the contact is a point contact (such as by further determining a contact area and/or pressure, for example). If a point contact is determined, then a determination can be made that the gesture is a digit-in-ear gesture as illustrated in FIG. 3. In response, at 1010, a volume of audio corresponding to objects can be decreased proportionally based upon a detected pressure applied by the digit without changing a volume of ambient noise.

If the contact is determined not to be a point contact, then a determination can be made that the gesture is a cupped hand gesture as illustrated in FIG. 5. In response, at 1012 a determination can be made if a digit-to-palm angle meets a threshold (such as 70 degrees, for example), as illustrated in FIG. 7. If the angle does not meet the threshold, then, at 1018, a master sound level can be increased. If the angle does meet the threshold, then, at 1014, gaze tracking can be performed as described for FIGS. 6 and 7. At 1016, a sound level can be increased for tracked/selected object(s). For all cases, upon removal of the gesture, at 1020, the volume/audio control can return to a default value.

Figure 11:
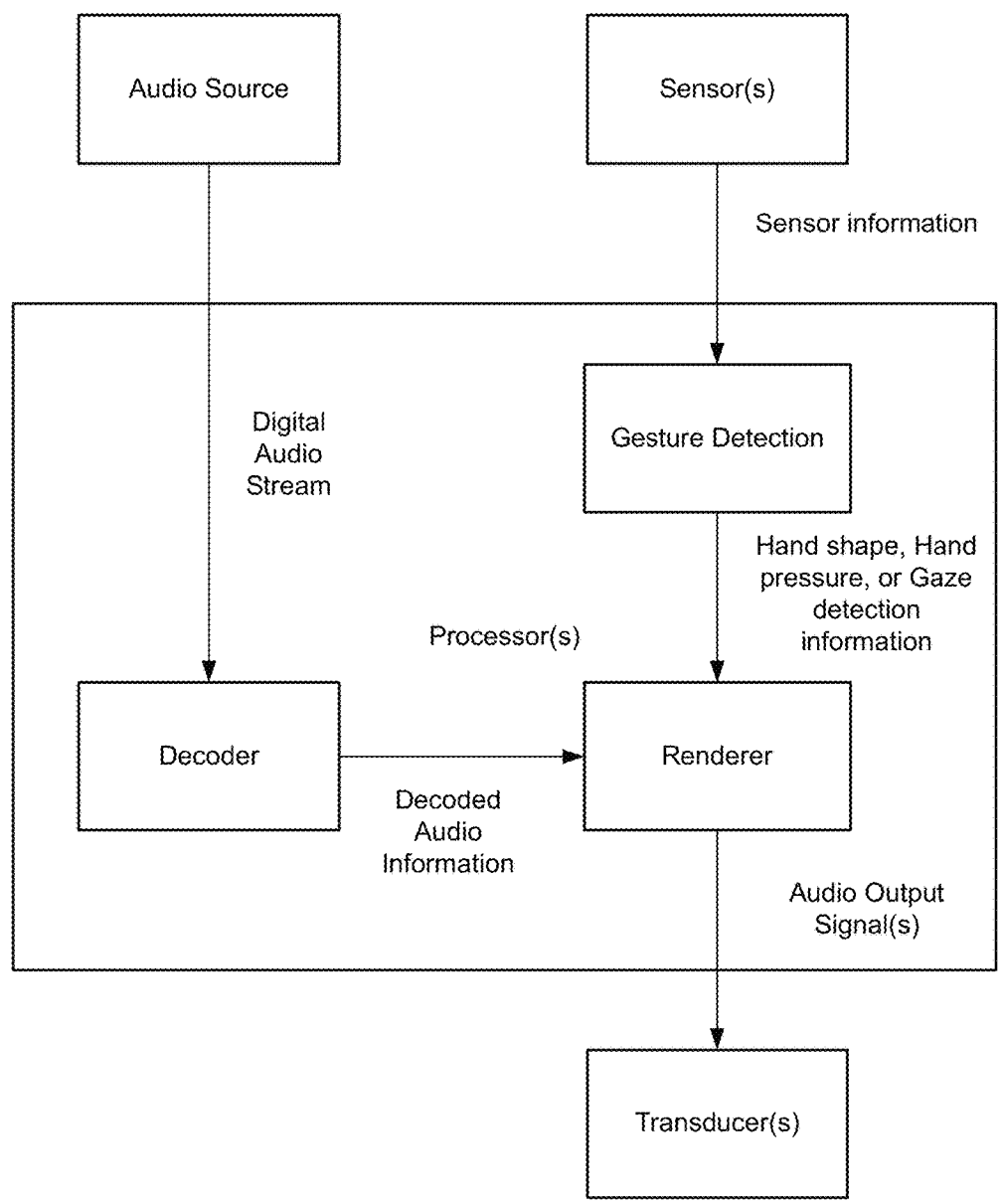
FIG. 11 illustrates a simplified block diagram that can be used to implement features of the disclosure.

FIG. 11 illustrates an example system 1100 that includes one or more processors for implementing features of the disclosure. The one or more processors can be coupled to a display used for augmented and/or virtual reality. The one or more processors can receive a digital audio stream from an audio source. As disclosed herein, the digital audio stream can include audio formatted in a variety of manners (e.g., channel based audio encoding, object based audio encoding, or ambisonic based audio encoding). The decoder can extract audio information from the digital audio stream for the renderer. For example, the decoder can separate audio information for each of a plurality of audio objects from the digital audio stream. In certain embodiments, the decoder can extract background or other audio information as well. For example, using certain techniques disclosed herein (e.g., as illustrated in FIGS. 3 and 4, background audio may or may not be affected).

The renderer can receive decoded audio information from the Decoder. In certain embodiments, the renderer can modify the decoded audio information such that audio may be output to one or more transducers to modify audio according to gesture based features of the disclosure. For example, gesture detection can be implemented by the one or more processors by receiving sensor information from one or more sensors. The sensor information can aid in determining if a disclosed gesture is performed by a use (optionally including a pressure applied using a gesture) and/or to determine if a user is gazing at an object. The sensor(s) can include imaging sensor(s), pressure sensor(s), or other. The gesture detection module can provide gesture or gaze detection information to the renderer. The gesture or pressure information can include a gesture, object identifier, and/or a command code, for example. For example, a command code can indicate that all audio included in the decoded audio information is to be muted or that a specific audio object is to be muted.

Renderer can perform a variety of functions. For example, renderer can receive the decoded audio information and provide corresponding audio output signal(s) to the one or more transducers. For example, there may be 2, 5, 7, or other numbers of transducer in a variety of configurations and/or locations. Renderer can modify the decoded audio information and provide appropriate audio signal(s) to each of the one or more transducers. The audio signal(s) can be generated based on the number or types of transducer(s) and/or position information, for example. System 1100 can implement a virtual reality system wherein audio may be modified depending on a location and/or orientation of a user. The renderer may also (using gesture and/or gaze information provided by the gesture detection module) modify and/or generate audio output signal(s) to the one or more transducers. For example, the renderer can identify an audio object based on the decoded audio information. The renderer may also determine, using gaze information, that a user has selected the audio object for modification. For example, the user may perform a disclosed gesture while gazing at an audio object. Renderer may then modify the audio object that has been selected by the user in the manner commanded by the user via a gesture. Similarly, the renderer can modify several audio objects, background audio, and/or other audio based on receiving certain gesture(s).

Figure 12:
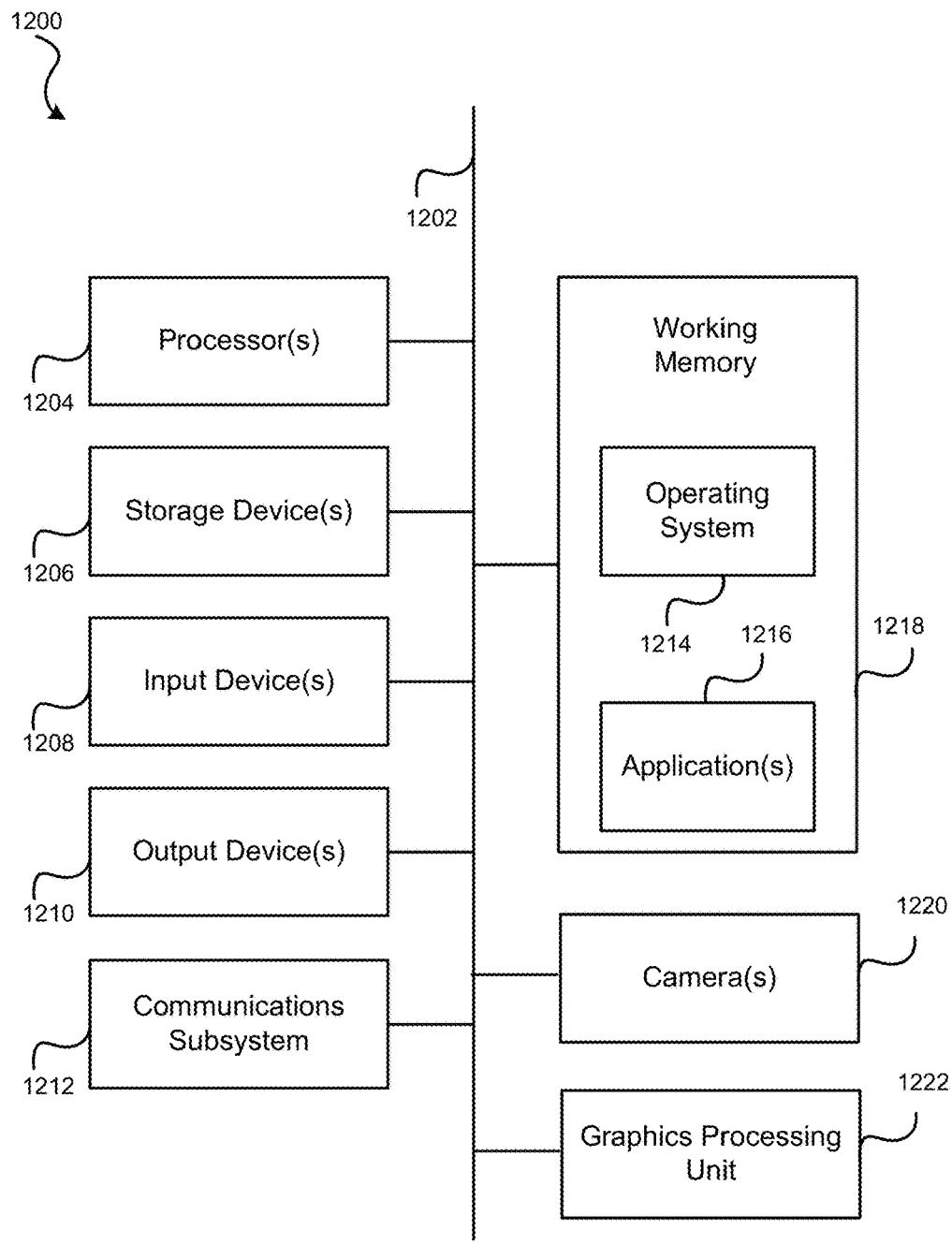
FIG. 12 illustrates an example of a computing system in which one or more embodiments may be implemented.

FIG. 12 illustrates an example of a computing system in which one or more embodiments may be implemented.

A computer system as illustrated in FIG. 12 may be incorporated as part of the above described computerized device. For example, computer system 1200 can represent some of the components of a television, a computing device, a server, a desktop, a workstation, a control or interaction system in an automobile, a tablet, a netbook or any other suitable computing system. A computing device may be any computing device with an image capture device or input sensory unit and a user output device. An image capture device or input sensory unit may be a camera device. A user output device may be a display unit. Examples of a computing device include but are not limited to video game consoles, tablets, smart phones and any other hand-held devices. FIG. 12 provides a schematic illustration of one implementation of a computer system 1200 that can perform the methods provided by various other implementations, as described herein, and/or can function as the host computer system, a remote kiosk/terminal, a point-of-sale device, a telephonic or navigation or multimedia interface in an automobile, a computing device, a set-top box, a table computer and/or a computer system. FIG. 12 is meant only to provide a generalized illustration of various components, any or all of which may be utilized as appropriate. FIG. 12, therefore, broadly illustrates how individual system elements may be implemented in a relatively separated or relatively more integrated manner.

The computer system 1200 is shown comprising hardware elements that can be electrically coupled via a bus 1202 (or may otherwise be in communication, as appropriate). The hardware elements may include one or more processors 1204 (which can be similar to the one or more processors depicted in FIG. 11), including without limitation one or more general-purpose processors and/or one or more special-purpose processors (such as digital signal processing chips, graphics processing units 1222, and/or the like); one or more input devices 1208, which can include without limitation one or more cameras, sensors, a mouse, a keyboard, a microphone configured to detect ultrasound or other sounds, and/or the like; and one or more output devices 1210, which can include without limitation a display unit such as the device used in implementations of the invention, a printer and/or the like. Additional cameras 1220 may be employed for detection of user's extremities and gestures. In some implementations, input devices 1208 may include one or more sensors such as infrared, depth, and/or ultrasound sensors. The graphics processing unit 1222 may be used to carry out the method for real-time wiping and replacement of objects described above.

In some implementations of the implementations of the invention, various input devices 1208 and output devices 1210 may be embedded into interfaces such as display devices, tables, floors, walls, and window screens. Furthermore, input devices 1208 and output devices 1210 coupled to the processors may form multi-dimensional tracking systems.

The computer system 1200 may further include (and/or be in communication with) one or more non-transitory storage devices 1206, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 1200 might also include a communications subsystem 1212, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1212 may permit data to be exchanged with a network, other computer systems, and/or any other devices described herein. In many implementations, the computer system 1200 will further comprise a non-transitory working memory 1218, which can include a RAM or ROM device, as described above.

The computer system 1200 also can comprise software elements, shown as being currently located within the working memory 1218, including an operating system 1214, device drivers, executable libraries, and/or other code, such as one or more application programs 1216, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1206 described above. In some cases, the storage medium might be incorporated within a computer system, such as computer system 1200. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 1200 and/or might take the form of source and/or installable code, which, upon compilation and/or installation on the computer system 1200 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 1200 may be omitted or may be implemented separate from the illustrated system. For example, the processor 1204 and/or other elements may be implemented separate from the input device 1208. In one implementation, the processor may be configured to receive images from one or more cameras that are separately implemented. In some implementations, elements in addition to those illustrated in FIG. 12 may be included in the computer system 1200.

Some implementations may employ a computer system (such as the computer system 1200) to perform methods in accordance with the disclosure. For example, some or all of the procedures of the described methods may be performed by the computer system 1200 in response to processor 1204 executing one or more sequences of one or more instructions (which might be incorporated into the operating system 1214 and/or other code, such as an application program 1216) contained in the working memory 1218. Such instructions may be read into the working memory 1218 from another computer-readable medium, such as one or more of the storage device(s) 1206. Merely by way of example, execution of the sequences of instructions contained in the working memory 1218 might cause the processor(s) 1204 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 1200, various computer-readable media might be involved in providing instructions/code to processor(s) 1204 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 1206. Volatile media include, without limitation, dynamic memory, such as the working memory 1218. Transmission media include, without limitation, coaxial cables, copper wire and fiber optics, including the wires that comprise the bus 1202, as well as the various components of the communications subsystem 1212 (and/or the media by which the communications subsystem 1212 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1204 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1200. These signals, which might be in the form of electromagnetic signals, acoustic signals, optical signals and/or the like, are all examples of carrier waves on which instructions can be encoded, in accordance with various implementations of the invention.

The communications subsystem 1212 (and/or components thereof) generally will receive the signals, and the bus 1202 then might carry the signals (and/or the data, instructions, etc. carried by the signals) to the working memory 1218, from which the processor(s) 1204 retrieves and executes the instructions. The instructions received by the working memory 1218 may optionally be stored on a non-transitory storage device 1206 either before or after execution by the processor(s) 1204.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

What is claimed is:

1. A system, comprising:
one or more sensors configured to detect a control object comprising a hand of a user;
a gaze-tracking sensor configured to enable determination of a direction of a gaze of the user;
a transducer; and
one or more processors coupled to the one or more sensors and the transducer, the one or more processors configured to:
identify, using the one or more sensors, a first gesture performed by the user via the control object, wherein the first gesture includes a cupped hand of the user placed in proximity to an ear of the user to increase an amplitude of sound waves travelling towards the user's ear;

identify, based on the direction of the gaze and the first gesture, one or more audio objects within an area of an environment that the user is gazing upon;

identify, using the one or more sensors, a second gesture performed by the user via the control object, wherein the second gesture includes drawing an outline around an audio object;

select, based at least in part on the first gesture, second gesture, and the direction of the gaze, the audio object;

generate a first signal based on the selected audio object; and transmit the first signal to the transducer, the first signal causing the transducer to: (1) generate a sound that mimics an effect of the modification to the sound waves by the control object via the first gesture; or (2) cease generating a sound to mimic an effect of the modification to the sound waves by the control object via the first gesture, wherein the generated sound or the sound that is ceased to be generated corresponds to the selected audio object, wherein the selected audio object is one of a plurality of audio objects, each of the plurality of audio objects individually controllable by the one or more processors.

2. The system of claim 1, wherein the one or more processors are configured to receive and modify a second signal; and wherein the generating the first signal is based on modifying the second signal.

3. The system of claim 2, wherein the first signal includes a digital audio stream and wherein the generating the first signal includes decoding the digital audio stream.

4. The system of claim 1, wherein the one or more processors are further configured to:

transmit the first signal to the transducer while the first gesture is identified; and cease transmitting the first signal to the transducer in response to the first gesture being no longer identified.

5. The system of claim 1, wherein the first gesture includes at least partially covering an ear of the user and the mimicking the effect includes decreasing an amplitude of the sound.

6. The system of claim 1, wherein the effect is a first effect in response to the first gesture being identified as the hand being formed and located to imitate plugging an ear canal of the user with a digit of the hand; and the mimicking the effect is a second effect, different from the first effect, to imitate covering the ear canal with a palm of the hand.

7. The system of claim 1, further comprising a pressure sensor; and the one or more processors are configured to:

determine a magnitude of pressure applied by the hand of the user to the pressure sensor; and wherein the sound is generated mimicking the effect based on the magnitude of the pressure.

8. The system of claim 1, wherein the generating the sound includes independently generating a respective sound for a left ear of the user and a right ear of the user depending on a location of the control object in relation to the left ear or the right ear when performing the first gesture.

9. The system of claim 1, further comprising a head-mounted display; and wherein the one or more sensors are mounted to the head-mounted display.

10. The system of claim 9, wherein the one or more sensors include a contact sensor configured to determine contact between the control object and the head-mounted display.

11. A method, comprising:

determining, based on information from a gaze-tracking sensor, a direction of a gaze of a user;

identifying, using one or more sensors, a first gesture performed by the user via a control object comprising a hand of the user, wherein the first gesture includes a cupped hand of the user placed in proximity to an ear of the user to increase an amplitude of sound waves travelling towards the user's ear;

identifying, based on the direction of the gaze and the first gesture, one or more audio objects within an area of an environment that the user is gazing upon;

identifying, using the one or more sensors, a second gesture performed by the user via the control object, wherein the second gesture includes drawing an outline around an audio object;

selecting, based at least in part on the first gesture, second gesture, and the direction of the gaze, the audio object;

generating, by one or more processors, a first signal based on the selected audio object; and either:

(1) generate a sound that mimics an effect of the modification to the sound waves by the control object via the first gesture; or (2) cease generating a sound to mimic an effect of the modification to the sound waves by the control object via the first gesture, wherein the generated sound or the sound that is ceased to be generated corresponds to the selected audio object, wherein the selected audio object is one of a plurality of audio objects, each of the plurality of audio objects individually controllable by the one or more processors.

12. The method of claim 11, wherein the one or more sensors are mounted to a head-mounted display.

13. The method of claim 12, further comprising selecting the selected audio object from within an at least partially virtualized environment displayed to the user via the head-mounted display.

14. The method of claim 12, wherein the gaze-tracking sensor includes a contact sensor configured to determine contact between the control object and the head-mounted display.

15. The method of claim 12, wherein the head-mounted display is configured to display a virtualized environment to the user; and the sound is generated for the selected audio object viewed by the user in the virtualized environment.

16. An apparatus, comprising:

means for determining a direction of a gaze of a user;

means for identifying a first gesture performed by the user via a control object comprising a hand of the user, wherein the first gesture includes a cupped hand of the user placed in proximity to an ear of the user to increase an amplitude of sound waves travelling towards the user's ear;

means for identifying, based on the direction of the gaze and the first gesture, one or more audio objects within an area of an environment that the user is gazing upon;

means for identifying, using the one or more sensors, a second gesture performed by the user via the control object, wherein the second gesture includes drawing an outline around an audio object;

means for selecting, based at least in part on the first gesture, second gesture, and the direction of the gaze, the audio object;

means for generating a first signal based on the selected audio object; and means for transmitting the first signal to a means for generating sound, the first signal causing the means for generating sound to:
(1) generate a sound mimicking an effect of the modification to the sound waves by the control object via the first gesture; or
(2) cease generating a sound to mimic an effect of the modification to the sound waves by the control object via the first gesture,
wherein the generated sound or the sound that is ceased to be generated corresponds to the selected audio object, wherein the selected audio object is one of a plurality of audio objects, each of the plurality of audio objects individually controllable.

17. The apparatus of claim 16, further comprising a means to display an environment to the user, wherein the sound is generated for the selected audio object within an environment displayed on the means to display.

18. The apparatus of claim 17, wherein the means for identifying the first gesture includes a proximity sensor configured to determine proximity between the control object and an ear of the user.

19. A non-transitory, computer readable medium storing instructions that, when executed by one or more processors, cause the one or more processors to:

determine, based on information from a gaze-tracking sensor, a direction of a gaze of a user;

identify, using one or more sensors, a first gesture performed by the user via a control object comprising a hand of the user, wherein the first gesture includes a cupped hand of the user placed in proximity to an ear of the user to increase an amplitude of sound waves travelling towards the user's ear;

identify, based on the direction of the gaze and the first gesture, one or more audio objects within an area of an environment that the user is gazing upon;

identify, using the one or more sensors, a second gesture performed by the user via the control object, wherein the second gesture includes drawing an outline around an audio object;

select, based at least in part on the first gesture, second gesture, and the direction of the gaze, the audio object;

generate a first signal based on the selected audio object; and transmit the first signal to a transducer, the first signal causing the transducer to:
(1) generate a sound that mimics an effect of the modification to the sound waves by the control object via the first gesture; or
(2) cease generating a sound to mimic an effect of the modification to the sound waves by the control object via the first gesture,
wherein the generated sound or the sound that is ceased to be generated corresponds to the selected audio object, wherein the selected audio object is one of a plurality of audio objects, each of the plurality of audio objects individually controllable by the one or more processors.

20. The non-transitory, computer readable medium of claim 19, wherein the one or more sensors are mounted to a head-mounted display.

21. The non-transitory, computer readable medium of claim 20, wherein the instructions, when executed by one or more processors, cause the one or more processors to:

display, via the head-mounted display, a virtualized environment to the user.

* * * * *